United States Patent [19]

Zarabadi et al.

[11] Patent Number: 5,151,625
[45] Date of Patent: Sep. 29, 1992

[54] HIGH FREQUENCY BIMOS LINEAR V-I CONVERTER, VOLTAGE MULTIPLIER, MIXER

[75] Inventors: Seyed R. Zarabadi; Mohammed I. El-Naggar; Nabil I. Khachab, all of Columbus, Ohio

[73] Assignee: The Ohio State University, Columbus, Ohio

[21] Appl. No.: 610,233

[22] Filed: Nov. 8, 1990

[51] Int. Cl.[5] .............................................. H03B 19/00
[52] U.S. Cl. .................................... 307/529; 307/495; 307/261; 328/156
[58] Field of Search ............... 307/529, 570, 254, 355, 307/261; 330/69, 254; 328/156

[56] References Cited

U.S. PATENT DOCUMENTS

| | | | |
|---|---|---|---|
| 4,458,210 | 7/1984 | Horl | 307/529 |
| 4,912,520 | 3/1990 | Yamamoto et al. | 307/529 |
| 4,937,516 | 6/1990 | Sempel | 307/529 |

OTHER PUBLICATIONS

Khachab et al., "MOS Multiplier/Divider Cell for Analogue VLSI", Electronic Letters, Nov. 9, 1989, vol. 25, pp. 1550-1551.

Primary Examiner—Timothy P. Callahan
Attorney, Agent, or Firm—Frank H. Foster

[57] ABSTRACT

A voltage to current converter, voltage multiplier and mixer circuit. At least two differential output, common source, pairs of matched field effect transistors have cross connected drains. Those transistors which do not have their drains connected together have their gates connected together to form a first pair of voltage input nodes. The two cross connections form output nodes providing differential output currents. A pair of impedance transformation, low output impedance, buffer amplifiers have bipolar transistor output stages and a high input field effect transistor input stage. The outputs of the output stages are each respectively connected to a different one of the common sources of the differential connected pairs. The input nodes of the input stages form a second pair of voltage input nodes. A low impedance, bipolar transistor, constant dc current, biasing circuit is connected to the common sources for biasing the field effect transistors of the differential pairs in their saturation region and for biasing the bipolar transistors in their active region.

20 Claims, 5 Drawing Sheets

HIGH FREQUENCY BIMOS LINEAR V-I CONVERTER, VOLTAGE MULTIPLIER, MIXER

TECHNICAL FIELD

This invention relates to electronic circuitry and more particularly relates to a circuit which is capable of operating at high frequency and performing voltage to current signal conversion, voltage multiplication and mixing.

BACKGROUND ART

With the advent of the BiMOS/BiCMOS technologies and much demand for analog signal processing functions in the MHz ranges, the analog designers are challenged to design circuits that outperform the very few available bipolar, only high frequency, circuit building blocks. The widely acceptable bipolar frequency multiplier is the Gilbert frequency multiplier which relies on current switching. The frequency multiplication of the Gilbert circuit is essentially based on the conversion of the carrier frequency to switching currents and execratively multiplying it to the multiplicand signal. The output of this circuit, at best, includes all of the odd harmonic carrier components, hence requiring a filtering function to select the desired output. The presented circuit of this disclosure tries to minimize the harmonic contents of the output and therefore tends to eliminate the usually required filtering functions while maintaining the high speed operation.

The recently developed v-i converter/frequency multipliers in MOS technologies have very limited frequency range of operation. Almost all of these circuits imitate the Gilbert multiplier circuit.

Some efforts in realizing BiCMOS circuits for analog-to-digital converters have been started. In this report, we attempt to disclose a BiCMOS v-i/frequency multiplier cell that incorporates bipolar and MOS devices for maximum performance and frequency of operation. This cell can be utilized as a building block in the realization of many analog functions such as phase/vector-lock-loops, modulators/demodulators, variety of analog signal processors for radio/TV applications and etc.

We first attempt to explain the design of the cell followed by the derivation of expressions describing the functions of the proposed cell. We then provide some computer simulation results representing the functional behavior of this cell. Finally, some experimental results of a simplified breadboarded version of this cell will be provided.

BRIEF DISCLOSURE OF INVENTION

The invention is a voltage to current converting, voltage multiplying and mixing circuit. The circuit has at least two differential connected pairs of source follower connected, matched MOS/FET transistors having cross connected drains. One transistor of each pair, specifically the transistors of each pair which do not have their drains connected together, have their gates connected together to form a first pair of voltage input nodes. The two cross connections from one drain of each pair to one drain of the other pair, each form an output node. These output nodes provide differential output currents. A pair of impedance transforming buffer amplifiers are connected, each to a different one of the common sources of the differential connected pairs. Each buffer amplifier comprises a low impedance, bipolar transistor, output stage preceded by a high input impedance field effect transistor input stage. The input nodes of the two field effect transistor input stages form a second pair of voltage input nodes. A low impedance, bipolar transistor, constant DC current biasing circuit is connected to bias the field effect transistors in their saturation region and to bias the bipolar transistors in their active region. The biasing circuit is preferably a plurality of parallel connected, bipolar transistors, connected in a current mirror configuration.

Figure 1:
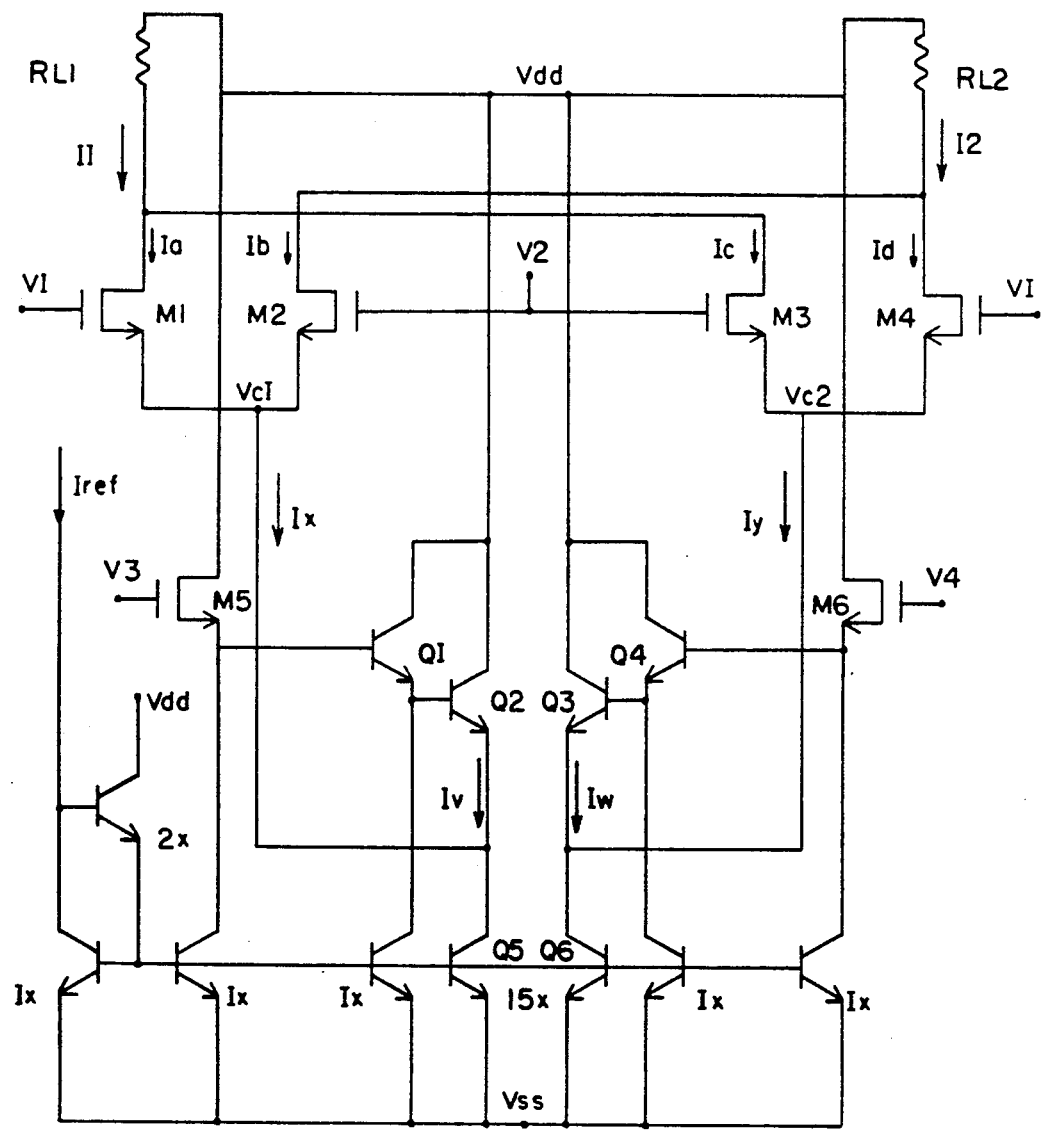
FIG. 1 is a schematic diagram of the preferred embodiment of the high speed V-I converter/multiplier/mixer circuit of the present invention.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art.

DETAILED DESCRIPTION

1 Design and Analysis

The circuit schematic of the proposed cell is shown in FIG. 1. We assume that all the NMOS transistors are operating in the saturation region and all the bipolar transistors are operating in the active region. Using the first order square law model of the NMOS transistors, M1–M4, and assuming nobody effect for these transistors, the differential output current $I_1-I_2$ flowing into the drains of these transistors is found as follows:

$$I_a = \frac{U_{eff} \times C_{ox} \times W_1}{2 \times L_1} (V_1 - V_{c1} - V_{T1})^2 \times (1 + \lambda_1 \times V_{DS1}) \quad [eq\ 1]$$

$$I_b = \frac{U_{eff} \times C_{ox} \times W_2}{2 \times L_2} (V_2 - V_{c1} - V_{T2})^2 \times (1 + \lambda_2 \times V_{DS2}) \quad [eq\ 2]$$

$$I_c = \frac{U_{eff} \times C_{ox} \times W_3}{2 \times L_3} (V_2 - V_{c2} - V_{T3})^2 \times (1 + \lambda_3 \times V_{DS3}) \quad [eq\ 3]$$

$$I_d = \frac{U_{eff} \times C_{ox} \times W_4}{2 \times L_4} (V_1 - V_{c2} - V_{T4})^2 \times (1 + \lambda_4 \times V_{DS4}) \quad [eq\ 4]$$

where $V_{c1}$ and $V_{c2}$ are:

$$V_{c1} = V_3 - V_{GS5} - V_{BE1} - V_{BE2} \quad [eq\ 5]$$

$$V_{c2} = V_4 - V_{GS6} - V_{BE3} - V_{BE4} \quad [eq\ 6]$$

Assuming $I_v > I_I$, $I_w > I_y$ and $I_w = I_v$, then the base-emitter voltages of $Q_1-Q_4$ remain constant (as long as $Q_5$ and $Q_6$ are operating in their active region) and $V_{BE1} = V_{BE4}$ and $V_{BE2} = V_{BE3}$. Since $I_{DS5} = I_{DS6}$ over a wide range of $V_3-V_4$ therefore, $V_{GS5} = V_{GS6}$ and the following expression holds true:

ti $V_{c1} - V_{c2} = V_3 - V_4 \quad [eq\ 7]$ if we assume $V_{T1} = V_{T2} = V_{T3} = V_{T4}$, $\lambda_1 = \lambda_2 = \lambda_3 = \lambda_4 = \lambda$, $V_{DS1} = V_{DS2} = V_{VS3} = V_{DS4} = V_{DS}$ and transistors M1-M4 have identical width to length ratios W/L then one obtains, $$I_1 - I_2 = 2 \times \frac{U_{eff} \times C_{ox} \times W}{L} (V_2 - V_1) \times \quad [eq\ 8]$$

$$(V_3 - V_4) \times (1 + \lambda \times V_{DS})$$

The value of $I_1-I_2$ can be easily amplified and converted to a voltage. It is noticed that this output current is linearly dependent of $V_2-V_1$ and $V_3-V_4$.

1.1 Voltage-to-Current Converter

Figure 2:
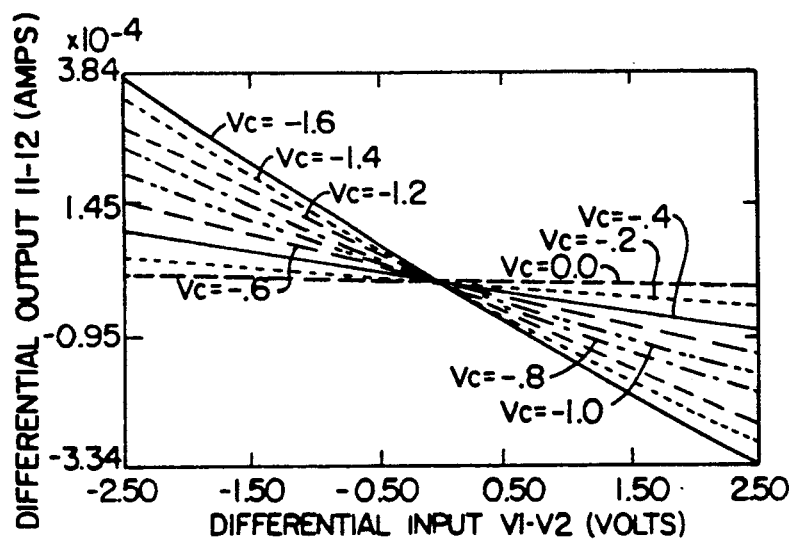
FIG. 2 is a graph illustrating the transfer function of the preferred embodiment, operated as a voltage to current converter.

By setting $V_3-V_4$=constant=K and $V_2=0.0$ V, $I_1-I_2$ will follow $V_1$ linearly. The gain of this v-i converter can be varied by K (assuming that all devices are operating in their allowed operating regions). Note that the value of K can be chosen to be either positive or negative. A design example of this v-i converter was simulated with SPICE and the results are shown in FIG. 2. For this simulation the voltages $V_2$ and $V_4$ were set to the zero potential. The input was applied to the $V_1$ terminal and $V_3$ was varied from 0 V to $-1.6$ V. The SPICE results shown in FIG. 2 were obtained for input voltages from $-2.5$ V to 2.5 V applied to the $V_2$ terminal (for $\pm 5$ V supply).

Figure 3:
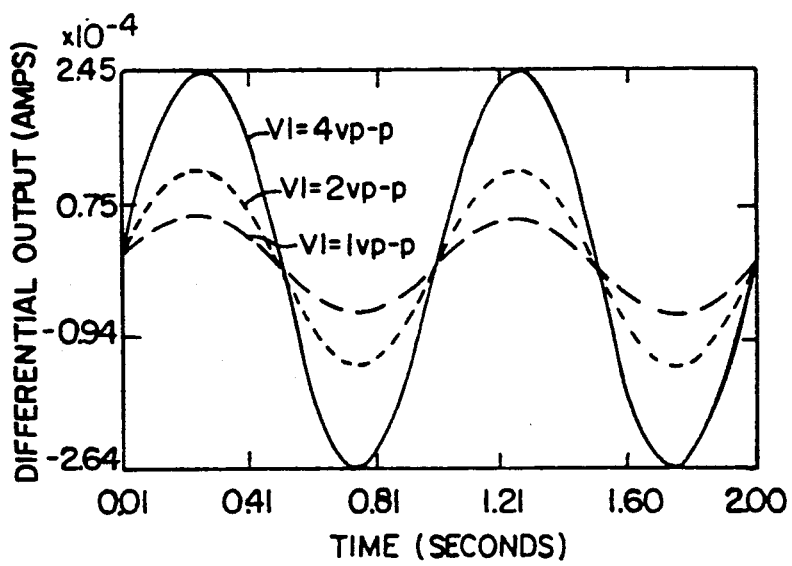
FIG. 3 is a graphical illustration of the time domain operation of the preferred embodiment, operated as a voltage to current converter illustrating the time domain current output for three different input voltages.

FIG. 3 represents the transient response for three different amplitudes sinewave signals of 1 MHz frequencies.

Fourier analysis was performed on the results from the transient analysis to obtain the nonlinearity (distortion) information.

Figure 4:
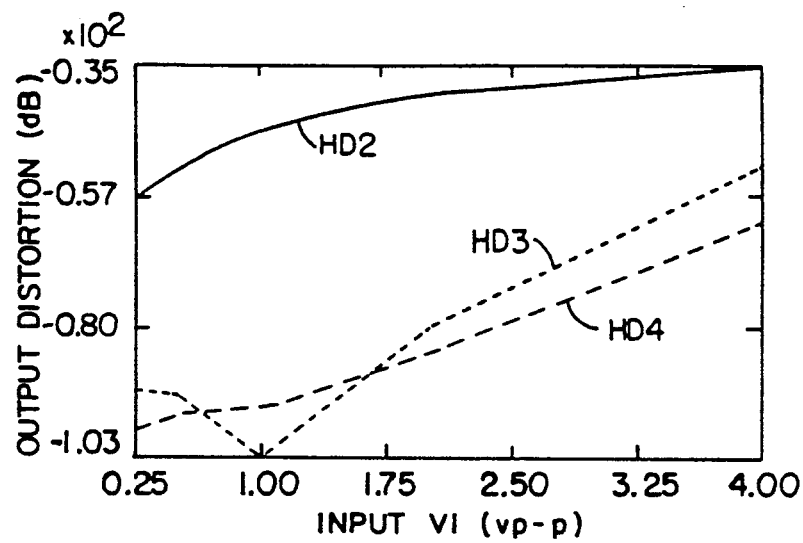
FIG. 4 is a graph illustrating the distortion/harmonic content of the current output for three different harmonics and for the total harmonic distortion. The output distortion is the ratio of harmonic amplitude to fundamental amplitude for each of those harmonics.

FIG. 4 shows the output current harmonic contents and the total harmonic distortion for signal amplitudes ranging from 0.25 Vp-p to 4 Vp-p at a frequency of 1 MHz. The second harmonic is observed to be the dominant component. This is caused by the residual nonlinearity from unequal NMOS transistors' $V_{DS}$ voltages, nonzero channel length modulation, $\lambda$, and the finite emitter impedance of Q2 and Q3 transistors with respect to the source impedance of M1-M4 transistors (better performance may be achieved for very small emitter impedance). The residual nonlinearity term (neglecting the source and emitter impedance effect) was derived to be, $$(I_1 - I_2)_{nonlinearity} = \frac{U_{eff} \times C_{ox} \times W \times \lambda}{2 \times L} [(V_1 - V_{c1} - T_{T1})^2 \times V_{DS1} \quad [eq\ 9]$$

$$+ (V_2 - V_{c1} - V_{T1})^2 \times (V_{DS1} + 2 \times V_{c1}) + (V_2 - V_{c2} - V_{T1})^2 \times V_{DS3} + (V_1 - V_{c2} - V_{T1})^2 \times (V_{DS4} + 2 \times V_{c2})] \quad [eq\ 10]$$

Note that by choosing devices that exhibit low value of $\lambda$ (large channel length) the second harmonic component can be reduced. This residual nonlinearity may also be sensed and compensated with additional circuits. This can be accomplished by introducing a feedback loop which in turn lowers the speed of operation.

As we mentioned before, linearity of v-i converter depends strongly on the relative emitter impedance of Q2-Q3 to the source impedance of M1-M4. The MOS implementation of this v-i converter is possible, however, it would require larger IC area and would have lower speed for the same value of nonlinearity.

1.2 Analog Frequency Multiplier (Mixer)

By choosing $V_1 = -V_2 = V_a$ and $V_3 = -V_4 = V_b$, the differential output current becomes, $$I_1 - I_2 = 8 \times \frac{U_{eff} \times C_{ox} \times W}{L} \times (1 + \lambda \times V_{DS}) \times V_a \times V_b \quad [eq\ 11]$$

The multiplication action is apparent from the $I_1-I_2$ expression. The DC transfer characteristics (SPICE results) of a design example of this multiplier circuit is shown in FIG. 5.

Figure 5:
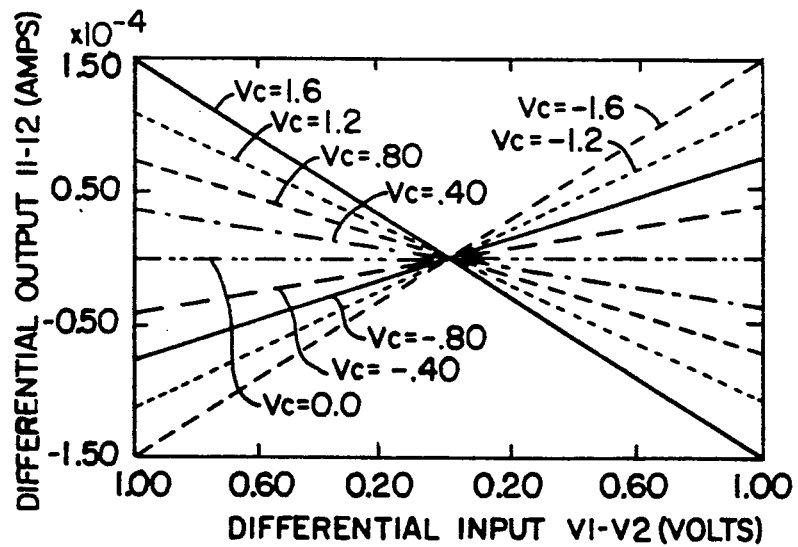
FIG. 5 is a graph illustrating the DC transfer function characteristics of the preferred embodiment operated as a frequency multiplier or mixer circuit.

The asymmetry of the curves in FIG. 5 clearly indicates that the second harmonic component is dominant. The speed of this multiplier was checked for frequencies up to 250 MHz using the SPICE program (the DC current was scaled up for the higher frequency operation).

Figure 6:
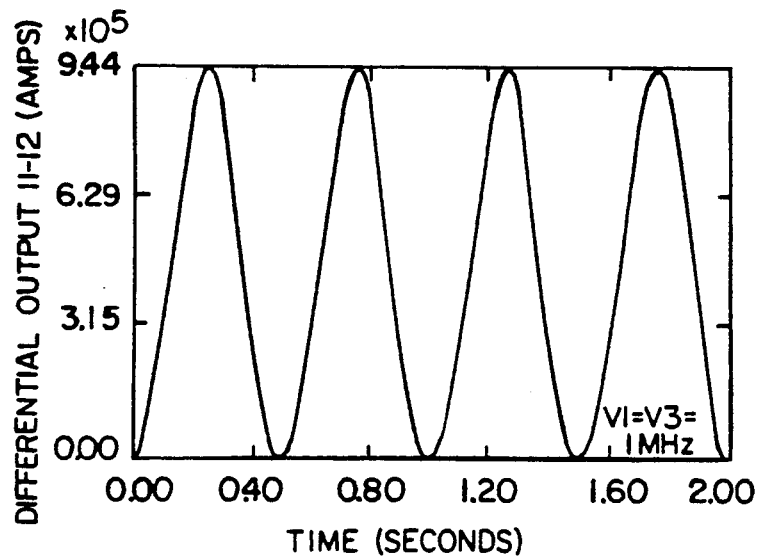
FIG. 6 is a graph illustrating the time domain output resulting from mixing two, 1 megahertz sine-wave signals illustrating the high second harmonic content of the sum and difference frequencies produced by the preferred embodiment of the invention operating as a mixer.

FIG. 6 presents the response of the frequency multiplier to two 1 MHz sinewaves with 2 Vp-p which were applied to $V_1$ and $V_3$ terminals, $V_2$ and $V_4$ terminals were set at zero potential.

Figure 7:
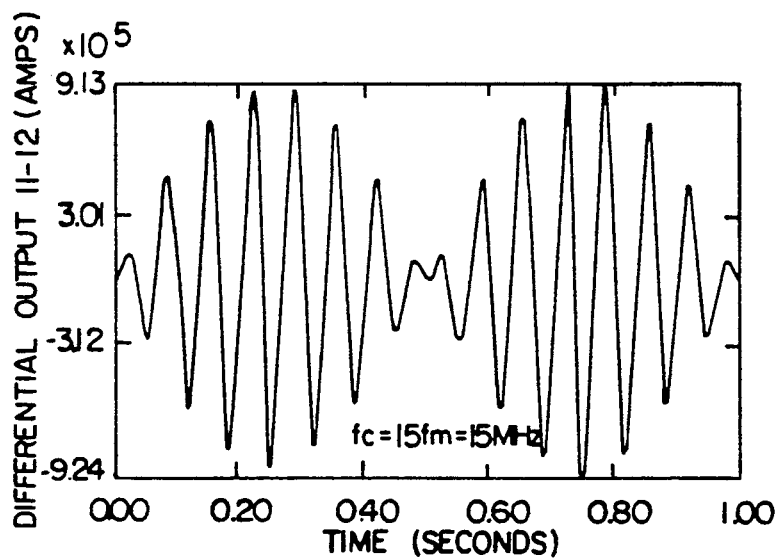
FIG. 7 is a graph illustrating the mixing of a 1 megahertz signal and a 15 megahertz signal showing a double side band, suppressed carrier waveform.

FIG. 7 presents a double side band suppressed carrier (DSB-SC) signal. This was generated by applying two sinewaves with frequencies of 1 MHz and 15 MHz and amplitudes of 2 Vp-p to the terminals $V_1$ and $V_3$ of the frequency multiplier while a zero potential was applied to $V_2$ and $V_4$ terminals.

Figure 8:
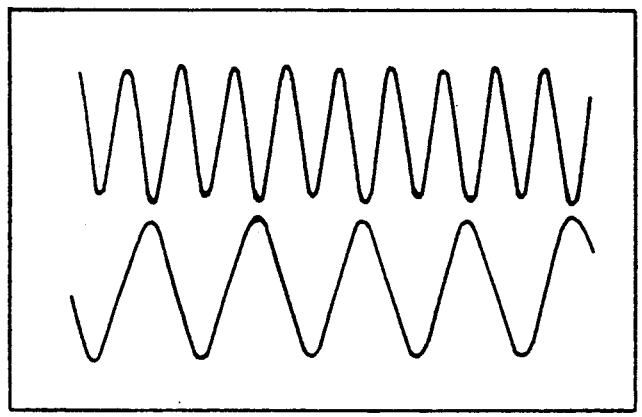
FIG. 8 is a graph illustrating the experimental results of mixing two 10 kilohertz sine-wave signals.
Figure 9:
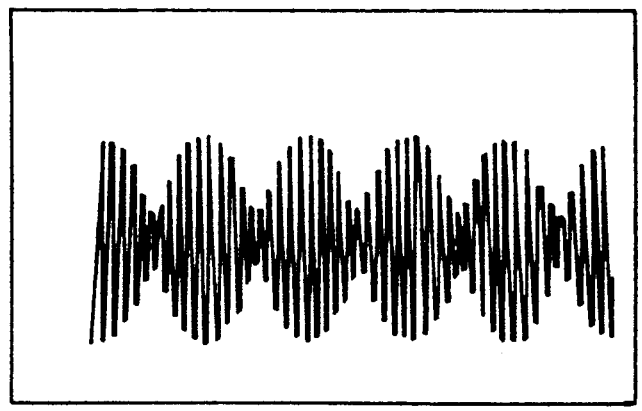
FIG. 9 is a graph illustrating the mixing of a modulating frequency of 1 kilohertz and a carrier frequency of 13 kilohertz to produce the characteristic double side band, suppressed carrier output signal.

The main portion of this frequency multiplier was breadboarded with discrete devices in order to compare its relative performance with the simulation results. FIGS. 8 and 9 present similar responses (except at much lower frequencies) as in FIGS. 6 and 7, respectively.

FIG. 8 shows the multiplication of two 10 KHz sinewaves and FIG. 9 presents the DSB-SC signal with the information frequency of 1 KHz and the carrier frequency of 13 KHz. These results are only presented to prove the validity of the claimed functions. We are planning to integrate this cell in two different BiCMOS processes (MOSIS and Delco Electronics Corporation BiCMOS processes) to further investigate its high frequency operation.

In this disclosure we have introduced a high speed BiCMOS v-i converter/frequency multiplier circuit that is expected to compete in performance and circuit complexity with the present counterpart designs. Due to the lower output harmonic contents, this cell as a frequency multiplier should relax the filtering functions that follow it. Also, due to the high speed capability, this cell should extend the frequency response of the circuits that are based on the linearized v-i converters.

Figure 10:
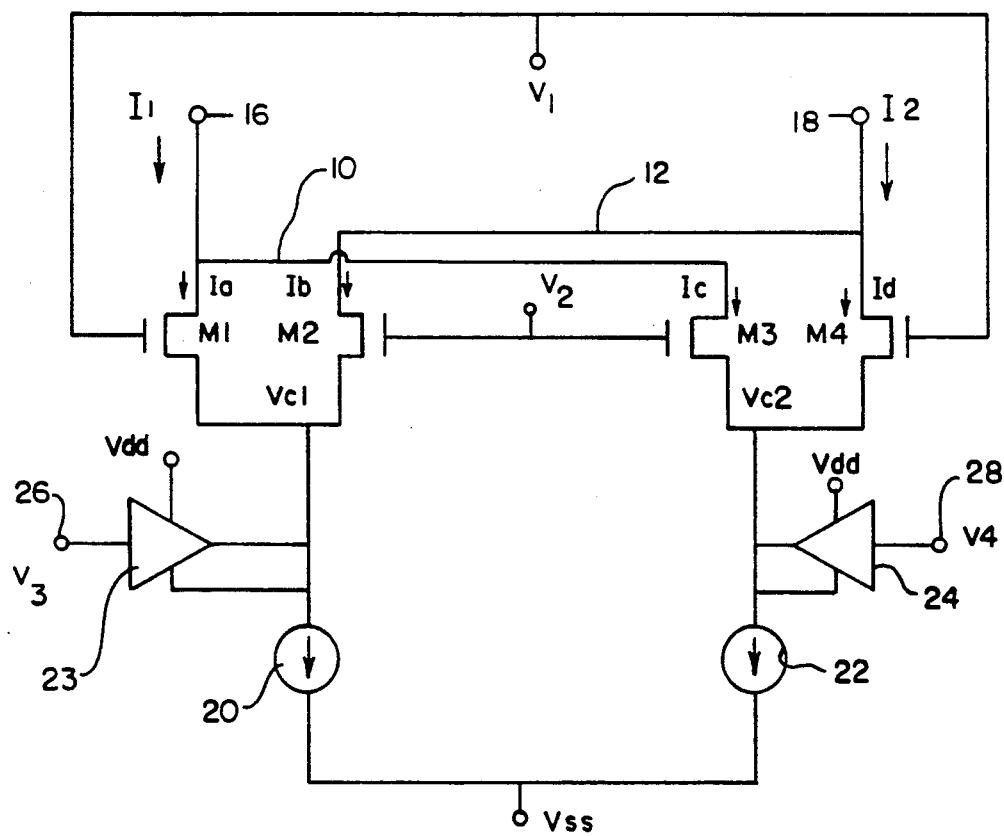
FIG. 10 is a simplified schematic diagram illustrating the principles of the invention.

FIG. 10 is a schematic of a circuit embodying the present invention which is simplified for purposes of illustration. The circuit has four matched FET transistors $M_1$, $M_2$ and $M_3$, $M_4$, arranged as two differential output pairs. The two pairs have cross connected drains which are connected by conductors 10 and 12. One transistor from each pair, the transistors which do not have their drains connected together, for example transistors M2 and M3, have their gates connected together to form a first pair of input voltage nodes, designated V1 and V2. Each cross connection node forms an output node 16 and 18 providing differential output currents I1 and I2. As is well known to those skilled in the art, such differential outputs are preferred in many applications for many reasons, including noise suppression. They are connected through the next stage to supply voltages as illustrated by $R_{L1}$ and $R_{L2}$ in FIG. 1.

Each pair of field effect transistors is connected to a low impedance, bipolar transistor, constant DC current, biasing circuit means 20 and 22. These constant current sources bias the field effect transistors in their saturation region and bias the bipolar transistors of amplifiers 23 and 24 in the active region of their characteristic curve. As illustrated in FIG. 1, it is preferred that the biasing circuit means comprises a plurality of parallel connected field effect transistors connected in a current mirror configuration.

The amplifiers 23 and 24 are each an impedance transformation buffer amplifier. Each amplifier has a low output impedance, bipolar transistor, output stage which, as illustrated in FIG. 1, is preferably darlington connected bipolar transistors, connected in an emitter-follower configuration. One output stage has transistors Q1 and Q2 and the other has transistors Q3 and Q4 of FIG. 1. Such output stages provide the very low output impedance which is required for operation of the present invention.

The input stages to each of the amplifiers 22 and 24 each comprise a field effect transistor, M5 and M6 in FIG. 1, in order to provide a high input impedance to which a voltage signal can be applied. The output stages of the amplifiers 23 and 24 are each connected to a different one of the common sources of the differential connected pairs. For example, the output of amplifier 23 is connected to the common sources of field effect transistors M1 and M2.

The input nodes of the amplifiers 23 and 24, which are the gate terminals of transistors M5 and M6 in FIG. 1, form a second pair of voltage input nodes 26 and 28.

Thus, it can be seen that there are four voltage input nodes 16, 18, 26, and 28 and two output nodes 16 and 18.

Preferably, the biasing current mirror circuit has an input stage to apply a variably controllable input reference current $I_{ref}$ to permit selected control of the magnitude of the current through the current mirror transistors.

Because the field effect transistors M1–M4 are essentially square law devices, the drain to source current of each may be represented by Equations 1, 2, 3, and 4. Equation 8 is the transfer function for the entire circuit. It illustrates that there are four voltage input nodes, $V_1$, $V_2$, $V_3$, and $V_4$. The selection of the signals to be applied to these four voltage input nodes determines which characteristic of the circuit will be utilized. Selection may be made to operate the circuit as a voltage-to-current converter, to operate the circuit as a voltage multiplier, or to operate the circuit as a mixer. Subsequent circuitry, such as active filters, can be utilized to select the portion of the output signal which is utilized.

As described above, the inputs are paired, one pair of inputs being $V_1$ and $V_2$ and the second pair being $V_3$ and $V_4$. In order to operate the circuit as a voltage-to-current converter, the input voltage may be applied to one voltage input terminal of one pair, with the other voltage input terminals being connected to a selected DC source, including zero volts. Alternatively, differential input voltage signals may be applied to both voltage input terminals of the same pair for operation in the differential signal mode. As is apparent from Equation 8, the DC level of the other pair, the pair to which the input signal is not applied, may have selected DC voltage levels applied to them in order to controllably select the desired circuit gain. For example, an input signal may be applied to $V_1$, while $V_2$ is set to zero. $V_3$ and $V_4$ may be selected to have voltages which, when $V_4$ is subtracted from $V_3$ provide a proportionality constant or gain factor. Alternatively, differential input voltages may be applied to $V_1$ and $V_2$ with $V_3$ and $V_4$ again used to determine the proportionality constant. Similarly, the voltage input signal to be converted to a differential current signal may be applied to $V_3$ or differential input voltage signals may be applied to $V_3$ and $V_4$ if the voltage at $V_1$ and $V_2$ is utilized to determine the proportionality constant or gain factor. The circuit may be operated as a voltage to current converter with either DC or small signal AC input signals.

The circuit may be used as a voltage multiplier or as a mixer by applying one of the signals to be multiplied or mixed to one input of a selected first one of the voltage input pairs and by applying the second signal to be multiplied or mixed to at least one of the voltage input nodes of the second pair of voltage input nodes. Thus, for example, one signal may be applied to $V_3$ while the second signal is applied to $V_1$. These signals may be AC or DC signals. The second node of each pair of voltage input nodes may be connected to a selected DC voltage level source, including zero. Consequently it can be seen from Equation 8 that this will provide a differential output signal at output nodes 16 and 18 which produce the product of the input signals. As is well known to those skilled in the art, the product of two sinusoidal signals produces a fundamental having an amplitude proportional to the product of the amplitude of the two signals and also produces sum and difference of the applied frequency components. DC input signals will produce an output voltage signal proportional to the product of the input signals (amplitude).

For mixing and voltage multiplication, the circuit may be operated in the differential mode. In that mode, the first signal is applied to the first pair of input nodes so that the voltage amplitude and the frequency at both of those input nodes is identical, but they are 180 degrees out of phase or of opposite polarity. The second signal is similarly applied to $V_3$ and $V_4$. Consequently, in this entirely differential mode, the output signal in the differential form at node 16 and 18 will be directly proportional to the product of the two differential input signals to provide the output like that described above.

Of course, signal squaring can also be accomplished by applying the same signal to at least one voltage input node of each pair of input nodes. Similarly, voltage squaring may be accomplished by applying differential inputs for the signal to both nodes of both pairs to accomplish multiplication of the signal by itself.

Consequently, it can be seen that circuit operation is fundamentally identical whether used as a voltage to current converter, voltage multiplier or mixer. The only difference between them is the signal applied to the input signals and the parameter of interest in the output. It can also be seen that for each pair of voltage input nodes there are three choices for the two nodes of each pair. One node can have a voltage signal applied to it, while the other node is at a zero volts. The second and similar possibility is that one node has a signal applied to it while the other node have a DC level shifting voltage applied to it. The third possibility is the differential operation where signals of identical magnitude and frequency, but opposite polarity are applied to the two nodes of a pair. If a signal is applied to only one pair of voltage input nodes the other node may be utilized to control circuit gain as described above.

The preferred embodiment of the invention may be modified by connecting additional field effect transistors in parallel with either pair of FET transistors to provide additional input signals.

In order to obtain circuit operation as described above, it is necessary that the amplifiers 23 and 24 have a very low output impedance. Consequently, operation of this circuit is only possible utilizing bipolar transistors in the output stages of these amplifiers, combined with the field effect transistors of the two cross connected pairs. In order to obtain the high speed, high frequency operation which this circuit can accomplish, it is necessary and now commercially possible to form all the transistors of the circuit integrated on the same substrate. Consequently, this circuit provides the very high input impedance to which voltage signals are applied, while providing the very low impedance amplifier output stages and high impedance current source biasing which is possible only with bipolar transistors. The low output impedance of the amplifier permits access to the control of the voltages $V_{c1}$ and $V_{c2}$ through a high input impedance device for application of signals $V_3$ and $V_4$. Consequently changes in voltage $V_3$ result approximately in identical changes in voltage $V_{c1}$ and similarly changes in voltage $V_4$, result in approximately identical changes in voltage $V_{c2}$.

The equations used above utilize parameters which are well known to those who are familiar with transistor technology and may be defined as follows:

$U_{eff}$—effective mobility.
$C_{ox}$—gate oxide capacitance per unit area.
W—gate width.
L—gate length.
$V_{Tn}$—FET threshold voltage
$\lambda$—modulation index.

While certain preferred embodiments of the present invention have been disclosed in detail, it is to be understood that various modifications may be adopted without departing from the spirit of the invention or scope of the following claims.

We claim:

1. A voltage to current converter, voltage multiplier and mixer circuit comprising:
   (a) at least two differential output, common source connected, pairs of matched field effect transistors having cross connected drains, the transistors which do not have their drains connected together having their gates connected together to form a first pair of voltage input nodes, the two cross connections each forming an output node providing differential output currents;
   (b) a pair of impedance transformation, buffer amplifiers each amplifier comprising a low output impedance, bipolar transistor, output stage and a high input impedance field effect transistor input stage, the outputs of the output stages each respectively connected to a different one of the common sources of said differential connected pairs and the input nodes of the input stages forming a second pair of voltage input nodes; and
   (c) a low impedance, bipolar transistor, constant DC current biasing circuit means connected to said common sources for biasing the field effect transistors of the differential pairs in their saturation region and biasing all bipolar transistors in their active region.

2. A circuit in accordance with claim 1 wherein said field effect transistors are NMOS/FET's and are formed and integrated on a common, same substrate as said bipolar transistors.

3. A circuit in accordance with claim 2 wherein said output stages each comprise an emitter follower connected bipolar transistor.

4. A circuit in accordance with claim 2 wherein said output stages each comprise darlington connected bipolar transistors.

5. A circuit in accordance with claim 1 or claim 4 wherein said input stages each comprise a field effect transistor.

6. A circuit in accordance with claim 5 wherein said biasing circuit means comprises a current mirror circuit including a plurality of parallel connected bipolar transistors.

7. A circuit in accordance with claim 6 wherein one of said bipolar transistors is connected to a current reference source for variably controlling the current in each bipolar transistor of the current mirror.

8. A circuit in accordance with claim 1 wherein said biasing circuit means comprises a current mirror circuit including a plurality of parallel connected bipolar transistors.

9. A circuit in accordance with claim 8 wherein one of said bipolar transistors is connected to a current reference source for variably controlling the current in each bipolar transistor of the current mirror.

10. A circuit in accordance with claim 1 wherein dc voltage sources are applied to three of said four voltage input nodes, and an input signal is applied to the fourth input node for voltage to current conversion.

11. A circuit in accordance with claim 1 wherein controllably variable constant dc voltage sources are connected to the input nodes of a selected first one of said pairs of input nodes, the difference between the voltages of said dc voltage sources being controllable for adjustably varying the gain of the circuit.

12. A circuit in accordance with claim 11 wherein a constant voltage is applied to one of the voltage input nodes of the other second pair of voltage input nodes to which said variable, constant dc voltage sources are not connected and an input signal is applied to the second voltage input node of the second pair of voltage input nodes for voltage to current conversion.

13. A circuit in accordance with claim 12 wherein the constant voltage recited in claim 12 is zero volts.

14. A circuit in accordance with claim 1 wherein a first ac input signal source at a first frequency is connected to apply a first or signal to the voltage input nodes of said first pair of voltage input nodes at 180 degrees out of phase and wherein a second ac input signal source at a second frequency is connected to apply a second ac signal to the voltage input nodes of said second pair of voltage input nodes at 180 degrees out of phase for mixing said ac signals to generate sum and difference frequencies.

15. A circuit in accordance with claim 1 wherein a first signal source is connected to at least a first one of the two voltage input nodes of the first pair of voltage input nodes and a second signal source is connected to at least a first one of the two voltage input nodes of the second pair of voltage input nodes.

16. A circuit in accordance with claim 15 wherein both signal sources apply ac signals to generate differential output currents including a fundamental component having an amplitude proportional to the product of the amplitudes of said ac signals and sum and difference frequency components.

17. A circuit in accordance with claim 15 wherein the first and the second signal sources apply the identical signal to generate differential output currents including a fundamental having an amplitude proportional to the square of the amplitude of the input signals.

18. A circuit in accordance with claims 15 or 16 or 17 wherein the second of the two voltage input nodes of each pair of voltage input nodes is connected to zero volts.

19. A circuit in accordance with claims 15 or 16 or 17 wherein the second of the two voltage input nodes of each pair of voltage input nodes is connected to a signal source which is identical in peak amplitude and frequency but 180 degrees out of phase with the signal applied to the first input node of the same pair of voltage input nodes.

20. A circuit in accordance with claims 15 or 16 or 17 wherein the second of the two voltage input nodes of each pair of voltage input nodes is connected to a dc level shifting voltage.

* * * * *

UNITED STATES PATENT AND TRADEMARK OFFICE
CERTIFICATE OF CORRECTION

PATENT NO. : 5,151,625
DATED : September 29, 1992
INVENTOR(S) : Seyed R. Zarabadi et al.

It is certified that error appears in the above-identified patent and that said Letters Patent is hereby corrected as shown below:

On the title page, item [54], and column 1, line 1, change "BIMOS" to --BICMOS--. Column 1, line 23, change "execratively" to --effectively--. Column 3, line 31, change "$I_V > I_I$" to --$I_V \gg I_X$--; and change "$I_W > I_y$" to --$I_W \gg I_y$--; line 38, delete "ti"; line 51, change "of" to --on--; line 68, change "frequencies" to --frequency--. Column 5, line 31, change "12" to --I2--.

Signed and Sealed this

Fourteenth Day of September, 1993

Attest:

BRUCE LEHMAN

*Attesting Officer*

*Commissioner of Patents and Trademarks*